United States Patent [19]

Jahns

[11] 4,345,502

[45] Aug. 24, 1982

[54] MUSICAL INSTRUMENT PERFORMANCE AMPLIFIER

[75] Inventor: Edward R. Jahns, Fullerton, Calif.

[73] Assignee: CBS Inc., New York, N.Y.

[21] Appl. No.: 107,409

[22] Filed: Dec. 26, 1979

[51] Int. Cl.$^3$ .......................... G10H 1/02; H03F 3/26
[52] U.S. Cl. ...................................... 84/1.21; 84/1.27; 330/264; 330/269
[58] Field of Search ...................... 330/262, 264, 269; 84/1.21, 1.27

[56] References Cited

U.S. PATENT DOCUMENTS

| | | | |
|---|---|---|---|
| 3,862,367 | 1/1975 | Kono et al. | 330/264 |
| 4,096,443 | 6/1978 | Gilson | 330/264 |
| 4,235,144 | 11/1980 | Lubow et al. | 84/1.24 |
| 4,241,313 | 12/1980 | Takehara | 330/253 |
| 4,241,314 | 12/1980 | Iwamatsu | 330/253 |

OTHER PUBLICATIONS

Noll, FET Principles, Experiments & Projects, p. 56, (1975).

*Primary Examiner*—J. V. Truhe
*Assistant Examiner*—Forester W. Isen
*Attorney, Agent, or Firm*—Gausewitz, Carr, Rothenberg & Edwards

[57] ABSTRACT

The output section of a musical instrument performance amplifier comprises a pair of high impedance power field effect transistors connected to an output transformer to provide a relatively low push-pull drain load that effectively presents a high impedance constant current source to a loudspeaker. The amplifier, having such high impedance constant current source output, amplifies and sustains instrument sound, provides large amounts of power to the speaker over a wide range of speaker impedances, and enables production of high power harmonics.

4 Claims, 1 Drawing Figure

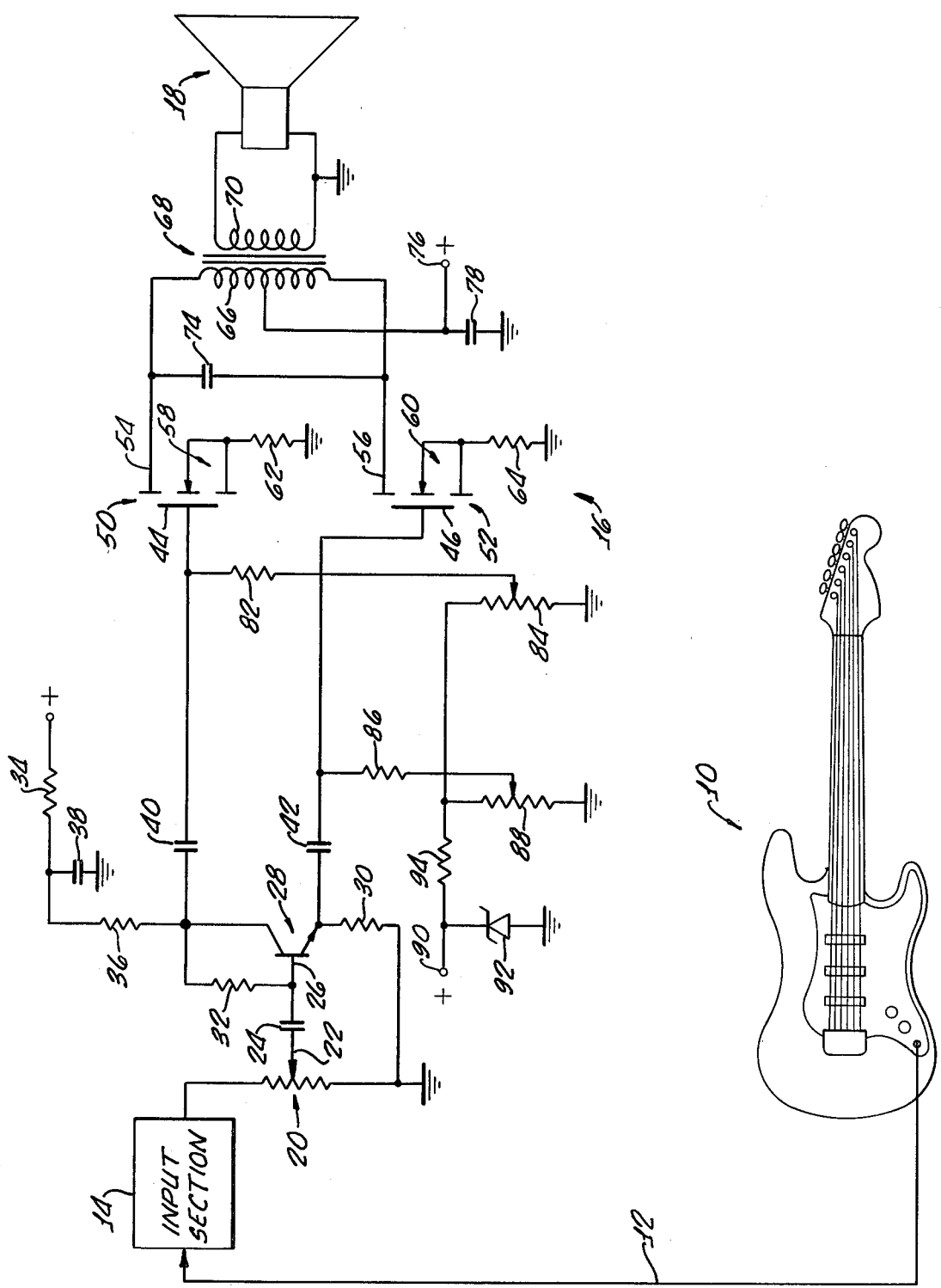

MUSICAL INSTRUMENT PERFORMANCE AMPLIFIER

BACKGROUND OF THE INVENTION

Musical instrument performance amplifiers such as, for example, the amplifier employed with an electric guitar, are quite different in a number of respects from those amplifiers, such as the amplifier of a high fidelity music system, wherein previously generated sound or music is to be precisely reproduced. In the high fidelity system desirable amplifier characteristics include a flat response. Performance of such an amplifier may be measured in part by the flatness of the response over a wide range of musical input frequencies and, in addition, freedom from ringing or sustaining of tones (damping) and minimum generation of overtones or harmonics.

In the musical instrument performance amplifier, on the other hand, the very characteristics that improve the high fidelity music reproducing amplifier are undesirable and would cause the sound of the instrument played through such an amplifier to sound flat, dull and uninteresting to the ears of a great majority of listeners.

Tube type amplifiers for use with a performing instrument such as a guitar, for example, have frequently included a pair of pentodes connected in push-pull to an output transformer and have required some feedback for various reasons including hum reduction.

Since the advent of transistors, increasingly greater numbers of amplifiers have been made with transistors instead of tubes. At present, a large majority of high fidelity sound reproducing amplifiers have transistor output sections. Commonly, transistor amplifiers, whether of the sound reproducing type or of the musical instrument performance type, employ bipolar output transistors which have a low output impedance. The low output impedance of such bipolar amplifiers helps to provide the flat highly damped response that is so desirable in the high fidelity reproducing system. This response is even further enhanced by the required provision of large amounts of feedback.

Tube type amplifiers provide higher source impedance to a speaker and provide musical instrument sound via the speaker that is more pleasant to the listener. The tube amplifier may provide some sustain of sounds reproduced by the speaker, but not the greater sustain that is most frequently desired. Further, its reproduction of harmonics, is at a decreased power, decreasing as frequency increases. The transistor amplifier, when used in applications for a musical instrument performance type amplifier, exhibits the many advantages of the transistor, including small size, lower power requirements, less heat generation and faster response time. Nevertheless, it finds little popularity in such application because of its lack of sustain and attenuated harmonics.

Accordingly, it is an object of the present invention to provide a performance amplifier for an electrical musical instrument which exhibits advantages of the transistor and yet provides significantly improved performance of the type desired in the creation of music by the playing of an electrical musical instrument.

SUMMARY OF THE INVENTION

In carrying out principles of the invention in accordance with a preferred embodiment thereof, a musical instrument performance amplifier for amplifying and sustaining sound produced by a musical instrument and for reproducing harmonics at increased power, has an input adapted to be connected to an electrical musical instrument and has a high impedance substantially constant current source output that is adapted to be connected to a loudspeaker. The constant current source output includes an output transformer and a pair of field effect transistors having a high output impedance. The constant current source output of the amplifier provides an output impedance, as seen by the speaker, that is many times greater than the nominal speaker impedance whereby speaker damping is decreased and harmonics of the sound created by the electrical musical instrument are reproduced at high power. According to a feature of the invention, full sound power is obtained over a wide range of speaker impedances whereby as the speaker impedance increases at higher harmonics, the power output rises and the desirable higher harmonics are produced at increased sound levels.

BRIEF DESCRIPTION OF THE DRAWING

The drawing illustrates an electric guitar connected to a loudspeaker via a musical instrument performing amplifier embodying principles of the invention.

DETAILED DESCRIPTION

As illustrated in the drawing, an electrical musical instrument such as an electric guitar 10 is to be played by a musician primarily for production or creation of music contemporaneously with the playing of the instrument. It may be noted that, although the described invention is uniquely adapted and designed for use with a loudspeaker or a contemporaneous and immediate reproduction of music being performed, the amplifier nevertheless may be connected to conventional recording instruments for subsequent reproduction of the instrument sound.

In playing the electrical musical instrument, the musical instrument sound is created when a string of the guitar is plucked. This sound or vibration is fed to a transducer which may be built into the guitar, to produce an electrical signal on an output lead 12 that represents the sound created by the playing of the instrument by the musician. The electrical signal is fed via lead 12 to an amplifier having an input section 14 and an output section generally indicated at 16, the latter being adapted to be connected by means of detachable connections (not shown) to a conventional loudspeaker or loudspeaker system indicated at 18.

The electrical signal created by the musician playing the guitar 10 is fed via the amplifier input section 14 to a master volume control potentiometer 20 from which a selectively variable amplitude signal is picked off via a potentiometer arm 22 and fed through a capacitor 24 to the base 26 of a signal-splitting transistor 28 having its emitter connected to ground via a resistor 30, having a feedback resistor 32 connected between its collector and base, and having a positive voltage applied to its collector via resistors 34,36, the junction of which is connected to ground via a capacitor 38.

Signals of mutually opposite phase are fed from the collector and emitter of transistor 28 respectively via coupling capacitors 40,42 to respective gate electrodes 44,46 of high power, high impedance field effect transistors 50,52 respectively. Transistors 50,52 have drain electrodes 54,56 and source electrodes 58,60, respectively, each of the latter being connected to ground via a respective one of resistors 62,64.

Drain electrodes 54,56 are connected in push-pull to opposite ends of the primary winding 66 of a transformer 68 which has a secondary winding 70 that is connected via output jacks (not shown) to a speaker system. The speaker system may contain one or more speakers, collectively designated at 18.

A capacitor 74 is connected across the primary 66 and between the drain electrodes 54,56 to block high frequency oscillations, oscillations generally in the order of 20,000 Hz or more. A positive voltage is applied to the transistor drain electrode 54,56 from a terminal 76 via a center tap of the transformer primary 66, terminal 76 being connected to ground via a capacitor 78.

Prior bipolar transistor output amplifiers commonly employ very high levels of feedback to minimize undesirable distortion. Tube amplifiers also employ feedback to reduce hum. Such feedback significantly lowers output impedance.

Since an important element of the present invention is the presentation to the speaker of a high impedance substantially constant current source, feedback is desirably minimized. According to a feature of the invention, selection of high impedance field effect transistors having a very high gain allows the use of an output section having no feedback to the output transistors.

Partly because of the absence of feedback, partly because of the very high gain of the transistors 50,52 and partly because of the fact that two production transistors are not likely to be precisely identical, the transistors are balanced by the provision of separate variable resistive networks connected between their gate electrodes and ground. Thus, the gate electrode 44 of transistor 50 is connected to ground via a series connected fixed resistor 82 and variable resistor 84. Gate electrode 46 is connected to ground via a series connected fixed resistor 86 and variable resistor 88. Bias for the transistor gates is provided from a positive voltage source at a terminal 90 which is controlled to a selected level by a zener diode 92 and fed to the variable resistors 84,88 via a resistor 94.

To balance the power transistors 50,52 variable resistors 84,88 are adjusted to provide equal current flow through the source electrode resistors 62,64.

A number of different types of high power field effect transistors may be employed in the practice of the present invention. A circuit such as that illustrated in the drawing has employed high impedance, high power field effect transistors, model SK/135 sold by Hitachi America Ltd. Other high power, high impedance field effect transistors that may be used in the practice of the present invention include the N channel power field effect transistors 2SK133 and 2SK135 and comparable P channel devices of Hitachi, power field effect transistors such as IRF300, 301, 305, 306 of International Rectifier and comparable MOS FET transistors made and sold by Siliconix.

As indicated above, these transistors provide a very high output impedance and can do so with a relatively low push-pull drain load in the order of 60 and 100 ohms. In the circuit illustrated in the drawing, for example, the power field effect transistors, having an output impedance in the order of 2500 ohms such, are connected to a step down transformer 68 having a turns ratio of approximately three to one. Thus, the very high transistor output impedance is provided with a low push-pull drain-to-drain load of about 60 ohms in this configuration, and presents to the speaker system 18 a high impedance source that is effectively a constant current source. In one configuration of the circuit illustrated in the drawing, the output impedance, as seen by the speaker, is found to be about 200 ohms at 1 KHz.

The average 8 ohm speaker has a nominal impedance of 8 ohms or, when two are connected in parallel, a nominal impedance of 4 ohms. This speaker impedance varies with frequency. Since the desired harmonics that are to be produced by the speaker have frequencies considerably higher than the fundamentals of notes created by the musical instrument that is played, the speaker impedance at such harmonics is significantly higher than its nominal impedance. In fact, the actual impedance of the speaker at certain harmonic frequencies of interest may increase to a value of 80 ohms.

In a conventional bipolar output transistor amplifier, the speaker sees a source impedance of less than 1 ohms. In a common tube type amplifier, source impedance seen by the speaker may be in the order of 5 ohms. In the described high impedance field effect transistor amplifier, source impedance as seen by the speaker is approximately 200 ohms. Thus, even at very high harmonic frequencies where the speaker impedance may rise to as much as 80 ohms, the source impedance is still significantly higher than the speaker impedance in the circuit of the present invention. In prior circuits, on the other hand, speaker impedance at higher frequencies may increase to a value significantly greater than the source impedance with concomitant loss of much of the desired usable sound quality of the performing instrument amplifier.

Advantages of the very high impedance constant current source presented to the speaker system by the amplifier described herein include greater sustaining of the notes played by the instrument and improved production of harmonics of such notes. Not only are the higher harmonics more readily produced, but, contrary to the performance of prior transistor and tube type amplifiers, where power output decreases as frequency increases, the illustrated circuit enables full sound power to be obtained over a range of speaker impedances from 8 to 80 ohms. In fact, output power actually increases with frequency in the illustrated circuit.

For example, in a bipolar output transistor amplifier, as output load increases (the speaker impedance increases with frequency) power output decreases significantly, almost in inverse proportion to the increase in output load. In a common tube type amplifier connected to a 4 ohm output (two 8 ohm speakers in parallel) output power varies with load (the load is the speaker of which impedance increases with frequency) as indicated in Table I.

TABLE I

| LOAD | OUTPUT |
|---|---|
| 4 ohms | 20 Watts |
| 5 ohms | 21 Watts |
| 6 ohms | 20 Watts |
| 8 ohms | 19 Watts |
| 10 ohms | 18 Watts |
| 12.5 ohms | 17 Watts |
| 15 ohms | 16 Watts |
| 20 ohms | 14 Watts |
| 25 ohms | 11 Watts |
| 30 ohms | 10 Watts |
| 40 ohms | 8 Watts |

In a circuit constructed according to the present invention, on the other hand, connected to an 8 ohm speaker, output power varies with load (speaker) impedance as in Table II.

TABLE II

| LOAD | OUTPUT |
|------|--------|
| 8 ohms | 20 Watts |
| 10 ohms | 25 Watts |
| 12.5 ohms | 31 Watts |
| 15 ohms | 37 Watts |
| 20 ohms | 44 Watts |
| 25 ohms | 45 Watts |
| 30 ohms | 42 Watts |
| 40 ohms | 37 Watts |
| 50 ohms | 32 Watts |
| 60 ohms | 28 Watts |
| 80 ohms | 23 Watts |

Measurements for both Tables I and II were made well below maximum output to prevent overload "levelling" restriction. Although the tube amplifier power output of Table I remains considerably higher than a comparable bipolar output transistor amplifier as load impedance increases, the power output does, in fact, decrease.

In the circuit of the present invention, on the other hand, as indicated in Table II, power output actually increases with load impedance, more than doubling as the load impedance is tripled and, even at a load impedance of 80 ohms, output power remains well above the output power at nominal load impedance.

This provision of full sound power over a wide range of speaker impedances (from 8 to 80 ohms), providing an output power that even increases with frequency and increasing load impedance, results in considerably higher sound levels of more desirable higher harmonics.

The greater improvement in sustain that is achieved with the described amplifier may be more clearly understood by considering the nature of the speaker. The common speaker cone is a vibratory element that is magnetically driven, frequently by a coil fixed to a portion of the speaker cone that interacts with and is therefore driven relative to a varying magnetic field. Assuming a short, sharp electrical pulse is applied from the driving source, the speaker cone is moved in accordance with the magnitude of the pulse. When the pulse is removed, so that no external electrical driving force is applied from the driving source, the speaker cone would continue to vibrate (if there is no damping), thus "sustaining" the note represented by the initial driving pulse. This sustaining of the driving signal is highly desirable in performing musical instrument amplification systems. However, as the speaker continues to vibrate, with its moving coil fluctuating in the permanent magnet field, an electromotive force is developed, the so-called back EMF, that causes a current to flow in the circuit that includes the speaker driving coil and the secondary winding of the output transformer. In other words, the "sustain" vibration of the speaker generates a current that flows through the driving source. If the driving source (the transformer secondary winding, together with the transformer primary and the output transistors connected thereto) has a relatively low impedance, this back EMF causes a relatively large current flow. The current generated by the back EMF opposes the "sustain" vibration of the speaker, providing a damping effect. The greater the amount of current, the greater the damping. The greater the damping the shorter the duration of "sustain" vibrations. Thus the sustain vibrations are opposed by the current generated by the back EMF. For increased sustain, whether for sustain of fundamentals of notes played by the performing instrument, or for sustain of harmonics, a high impedance speaker driving source is required. The greater the source impedance the greater the sustain.

The transformer ratio, approximately three-to-one in the described circuit, is chosen to provide a match between the drain-to-drain load of the field effect transistors and the nominal speaker impedance, the turns ratio being preferably substantially equal to the square of the ratio of the drain-to-drain load and speaker impedance. The described circuit enables use of low drain-to-drain load. For an 8 ohm speaker impedance and 60 ohm drain-to-drain load a turns ratio of about three turns of the primary winding to one turn of the secondary winding is preferred. As previously mentioned, this arrangement provides a source impedance as seen by the speaker of many times the nominal speaker impedance and several times greater than the speaker impedance even at highest frequencies of interest.

In summary, the greatly improved results obtained from the described amplifier are the richer and higher power harmonic generation and negligible speaker damping that sustains sounds generated by the guitar or other performing instrument. An amplifier with such characteristics is greatly preferred for use with a performing instrument such as a guitar where sound is created rather than merely reproduced.

The foregoing detailed description is to be clearly understood as given by way of illustration and example only, the spirit and scope of this invention being limited solely by the appended claims.

What is claimed is:

1. A music creating system comprising
   an electrical musical instrument such as an electric guitar or the like for generating electrical music signals,
   a speaker having an impedance, and
   amplifier means connected between said instrument and speaker for amplifying said electrical music signals and cooperating with said speaker for sustaining sounds generated by said electrical musical instrument and for providing harmonics of such sounds at higher power, said amplifier means comprising
   an input section for receiving electrical music signals generated by the instrument, and
   output means adapted to be connected to said speaker for providing an impedance considerably greater than the impedance of said speaker, said output means comprising
      a pair of power field effect transistors having output drain electrodes presenting an output impedance in the order of about twenty-five hundred ohms, and
      output transformer means connected to said drain electrodes in push pull for providing said transistors with a drain to drain load of not more than about one hundred ohms, whereby said output means provides a high impedance constant current source to said speaker connected thereto.

2. The amplifier of claim 1 wherein said transformer has a turns ratio of about three to one and wherein said constant current source has an impedance as seen by the speaker of more than one hundred ohms.

3. In a music system wherein a musical instrument is played to create sound through a speaker having a nominal speaker impedance, the combination with said instrument and speaker of apparatus for amplifying and sustaining sound created by said musical instrument and for providing high power amplification of harmonics thereof, said apparatus comprising an electronic amplifier having an input connected with said musical instrument and having a high impedance substantially constant current source output connected to said speaker, said substantially constant current source output comprising an output transformer connected to the speaker and having a turns ratio of about three to one, and a pair of high power high impedance field effect transistors having gate electrodes connected to receive signals from said amplifier input and having drain electrodes connected to said transformer, said drain electrodes forming the output electrodes of said transistors, said transistors and transformer having an output impedance greater than said nominal impedance at frequencies of harmonics of sound produced by said instrument, said substantially constant current source presenting an impedance of more than one hundred ohms to said speaker, whereby damping is decreased, sound produced by the musical instrument is sustained and harmonics are amplified.

4. In a music creating system wherein a musical instrument such as a guitar is played to create instrument sound, and wherein the instrument sound is amplified by an electronic amplifier and reproduced by a speaker that has a nominal impedance, an improved amplifier for cooperating with the speaker to reproduce and amplify instrument sound and harmonics thereof, said improved amplifier comprising, an input section adapted to receive electrical representation of sound as created by the instrument, and an output section having an output impedance as presented to the speaker that is many times greater than said nominal impedance, said output section comprising a high impedance substantially constant current source for said speaker and having an output power that increases as speaker impedance increases with frequency, whereby instrument sound is amplified and sustained and harmonics thereof are amplified at higher sound levels, said output section comprising an output transformer adapted to be connected to said speaker, and first and second high power field effect transistors having output drain electrodes coupled to said transformer in push pull, said transistors having high gain and high output impedance, said transformer having a low turns ratio thereby to provide said transistors with a drain to drain load of not greater than one hundred ohms with the transformer connected to a speaker having a nominal impedance not greater than about eight ohms.

* * * * *